United States Patent [19]
Suh et al.

[11] Patent Number: 5,299,166
[45] Date of Patent: Mar. 29, 1994

[54] DEVICE FOR PREVENTING EXCESS ERASING OF A NAND-TYPE FLASH MEMORY AND METHOD THEREOF

[75] Inventors: Kang-Deog Suh, Kyungki-do; Jin-Ki Kim, Seoul, both of Rep. of Korea

[73] Assignee: SamSung Electronics Co. Ltd., Suwon, Rep. of Korea

[21] Appl. No.: 920,643

[22] Filed: Jul. 28, 1992

[30] Foreign Application Priority Data

Aug. 14, 1991 [KR] Rep. of Korea .................. 1991-14096

[51] Int. Cl.$^5$ ............................................. G11C 11/40
[52] U.S. Cl. .................................... 365/218; 365/185; 365/900
[58] Field of Search ......................... 365/185, 218, 900

[56] References Cited

U.S. PATENT DOCUMENTS

| | | | |
|---|---|---|---|
| 4,939,690 | 7/1990 | Momodomi et al. | 365/184 |
| 4,962,481 | 10/1990 | Choi et al. | 365/185 |
| 5,075,890 | 12/1991 | Itoh et al. | 365/189.09 |

FOREIGN PATENT DOCUMENTS

0361972 4/1990 European Pat. Off. ............ 365/185

OTHER PUBLICATIONS

"New Ultra High Density EPROM and Flash EEPROM with NAND Structure Cell", Masuoka et al., IEDM Technical Digest, Dec. 6-9, 1987 pp. 552-555.
"A New NAND Cell for Ultra High Density 5V-Only EEPROMS", Shirota et al., 1988 Symposium on LVSI Technology, May 10-13, 1988/San Diego pp. 33-34.

Primary Examiner—Eugene R. LaRoche
Assistant Examiner—Andrew Tran
Attorney, Agent, or Firm—Robert E. Bushnell

[57] ABSTRACT

A device for achieving optimum erasure of the memory cells of a NAND type flash EEPROM. A memory string comprises a bit line, word lines and cell transistors with the gates respectively connected to the word lines and the channels cascaded between the bit line and ground voltage. A high voltage supplying device is connected between the bit line and the memory string for generating a first high voltage. A bit line selection transistor has the channel connected between the high voltage supplying device and the memory string and the gate connected to a bit line selection signal. In a first erasing operation, an erasing voltage applying device applies a first voltage to the gate of the bit line selection transistor and an erasing voltage to the gates of the cell transistors. In a second erasing operation, it applies a second voltage to the gate of selected transistor of the cell transistors, a third voltage to the gates of one group of the cell transistors between the selected cell transistor and the ground voltage, a second high voltage to the gates of another group of the cell transistors between the bit line and selected cell transistor and the gate of the bit line selection transistor, and the first high voltage to the drain of the selected cell transistor.

23 Claims, 7 Drawing Sheets

| | ERASE | WRITE | READ |
|---|---|---|---|
| BL | 0V | 20V | 5V |
| SSL | 5V | 20V | 5V |
| WL1 | 13V | 20V | 5V |
| WL2 | 13V | 20V | 5V |
| WL3 | 13V | 20V | 5V |
| WL4 | 13V | 20V | 5V |
| WL5 | 13V | 20V | 5V |
| WL6 | 13V | 0V | 0V |
| WL7 | 13V | 0V | 5V |
| WL8 | 13V | 0V | 5V |
| GSL | 5V | 0V | 5V |
*FIG. 1B* PRIOR ART
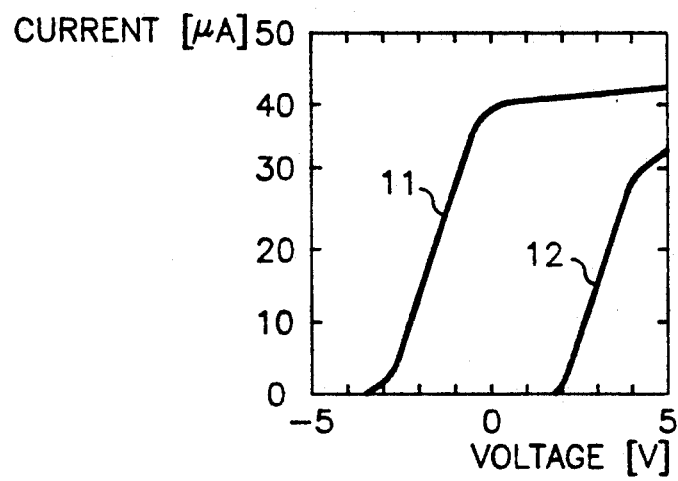
*FIG. 1C* PRIOR ART
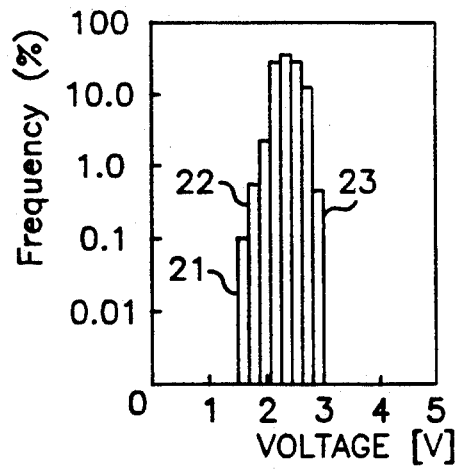
*FIG. 1D* PRIOR ART

|  | Pre-erase | Erase Trim | | | |
|---|---|---|---|---|---|
|  |  | M8 | M7 | ... | M1 |
| B/L | 0V | Vpb | Vpb | . | Vpb |
| SBG | 0V | Vppb | Vppb |  | Vppb |
| ST | 5V | Vppb | Vppb |  | Vthec |
| CT1 | Ver | Vppb | Vppb | . | 5V |
| CT2 | Ver | Vppb | Vppb |  | 5V |
| CT3 | Ver | Vppb | Vppb |  | 5V |
| CT4 | Ver | Vppb | Vppb | . | 5V |
| CT5 | Ver | Vppb | Vppb |  | 5V |
| CT6 | Ver | Vppb | Vppb | . | 5V |
| CT7 | Ver | Vppb | Vthec |  | 5V |
| CT8 | Ver | Vthec | 5V |  | 5V |
| GT | 5V | 5V | 5V | . | 5V |

DEVICE FOR PREVENTING EXCESS ERASING OF A NAND-TYPE FLASH MEMORY AND METHOD THEREOF

FIELD OF THE INVENTION

This invention relates to a NAND-type non-volatile flash memory device, and more particularly to a device and method for erasing the information stored in the memory cells of logic NAND.

TECHNICAL BACKGROUND OF THE INVENTION

Generally an electrically erasable and programmable read only memory (hereinafter called as "EEPROM") which is one of the non-volatile memory device tends to employ the structure of logic NAND as the complexity of the memory device is more and more increased. Such a logic NAND structure includes string units, each of which generates a single bit. One string unit includes cell transistors connected in series between a string selection transistor and a ground connection transistor.

A cell includes a floating-gate transistor. A necessary information stored in the cell is read according to a predetermined program. The information is retrieved by detecting the threshold voltage of a selected cell that is varied according to the state of the cell programmed or erased. A conventional EEPROM of NAND-type is disclosed in the IEEE Journals of Solid-State Circuit issued in August 1989 (pages 1238-1243) and April 1990 (pages 417-424).

FIG. 1A attached to the present application shows an equivalent circuit of a string unit of the conventional NAND-type EEPROM as disclosed in the above Journals. A string includes a string selection transistor ST, eight cascaded cell transistors CT1-T8, and a ground connection transistor GT for preventing the flow of cell current in a program or write mode and connecting the cell current to ground voltage Vss in a read mode.

A string selection line SSL is connected to the gate of the string selection transistor. Word lines WL1-WL8 are respectively connected to the gates of the cell transistors CT1-CT8. A ground selection line GSL is connected to the gate of the ground connection transistor GT.

With reference to FIGS. 1A and IB, the operation is described as follows.

In the erasing mode, 0V is applied to a bit line BL, 5V to the ground selection line GSL, and an erasing voltage Ver of 13V to the word lines WL1-WL8. Then the electrons in the substrate of the cell transistors flow into the floating-gates by the effect of the "Fowler-Nordhim Tunneling", thus the information stored in all the cells is erased. At this time, the threshold voltage of the cell transistors is 2-3V.

In case of performing a program or write operation to the sixth cell CT6, the string selection line SSL and the word lines WL1-WL5 are applied with a program voltage Vpr of 20V, while the word lines WL6-WL8 including the selected word line and the ground selection line GSL are applied with 0V. Then, there is formed an electric field between the floating gate and the drain of the Vselected cell transistor CT6, so that the electrons in the floating gate are discharged to the drain. At this time, the threshold voltage of the cell transistor CT6 is about −4 to −3V.

In case of performing a read operation to the selected cell transistor CT6, only the word line WL6 is applied with 0V, and the remaining word lines WL1-WL5,WL7,WL8, the string selection line SSL and the ground selection line GSL are all applied with 5 volt. Then the voltage difference (or the threshold voltage) between the source and the drain of the selected cell CT6 is detected on the bit line BL. If the threshold voltage is within 2 to 3V, the data is read as "1", which means that there are electrons in the floating gate. Also, if the threshold voltage is within −4 to −3V, the data is read as "0", which means that there are no electrons in the floating gate.

Referring to FIG. 1C, there are shown the current-voltage characteristics of an erased cell (Curve 12) and a programmed cell (Curve 11). The threshold voltage Vther of the erased cell is set between 2 and 3V, and the threshold voltage Vthpr of the programmed cell is set between −4 and −3V.

Although it is required that the threshold voltage of the erased cells be within the range of 2-3V, there may exist cells 21,22 and 23 having the threshold voltage beyond the range, as shown in FIG. 1D for illustrating in detail the threshold voltage distribution of the erased cells. This is caused by non-uniformity of the cells due to the high complexity. Moreover, if the erasing time is increased in order to adjust the threshold voltage of the under-erased (below 2V) and over-erased (over 3V) cells to the proper level, the threshold voltage of the over-erased cells gets more increased because the erasing operation is simultaneously performed on all the cells of the string.

Thus, when the third cell transistor CT3 is over-erased to have the threshold voltage over 5V, it can not be turned on to be read out because the gate voltage is lower than the threshold voltage. Also the over-erased cells can not be programmed to store data.

SUMMARY OF THE INVENTION

The object of this invention is to provide a device for achieving optimum erasure of the memory cells of a NAND-type EEPROM.

According to this invention, a device for achieving optimum erasure of the memory cells of a NAND type flash EEPROM includes:

(a) a memory strings including a bit line, word lines and cell transistors with the gates respectively connected to the word lines and the channels cascaded between the bit line and ground voltage;

(b) a high voltage supplying means connected between the bit line and the memory string for generating a first high voltage;

(c) a bit line selection transistor with the channel connected between the high voltage supplying means and the memory strings and the gate connected to a bit line selection signal; and (d) an erasing voltage applying means for applying a first voltage to the gate of the bit line selection transistor and an erasing voltage to the gates of the cell transistors in a first erasing operation, and applying a second voltage to the gate of selected one of the cell transistors, a third voltage to the gates of a group of the cell transistors between the selected cell transistor and the ground voltage, a second high voltage to the gates of another group of the cell transistors between the bit line and selected cell transistor and the gate of the bit line selection transistor, and the first high voltage to the drain of the selected cell transistor in a second erasing operation.

This invention will now be described more specifically with reference to the drawings attached only by way of example.

BRIEF DESCRIPTION OF DRAWINGS

FIG. 1B is a table for showing the method of erasing, writing and reading of the conventional circuit as shown in FIG. 1A;

FIG. 1C is a graph for showing the current-voltage characteristics of an erased and programmed cells of FIG. 1A;

FIG. 1D is a graph for illustrating the threshold voltage distribution of the erased cells of FIG. 1A;

DETAILED DESCRIPTION OF A CERTAIN PREFERRED EMBODIMENT

Figure 1A:
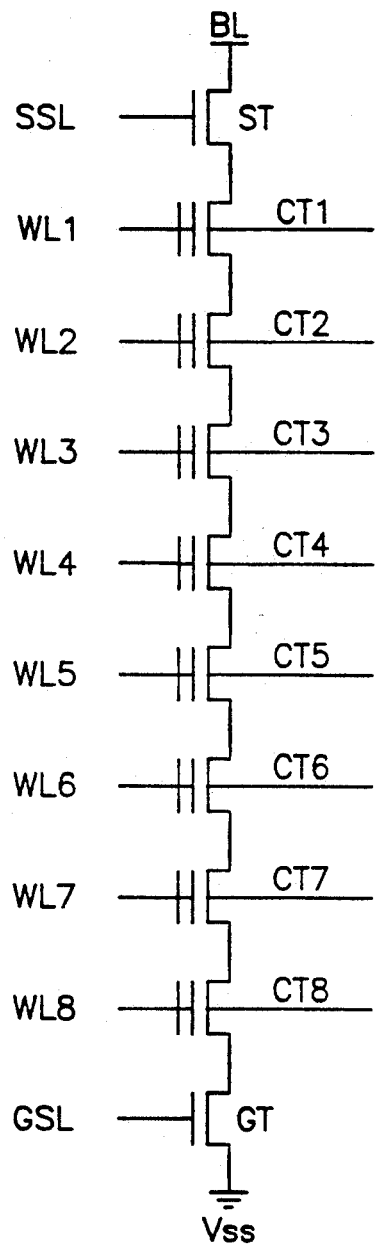
FIG. 1A is an equivalent circuit of a string unit in a conventional NAND type flash memory.
Figure 2A:
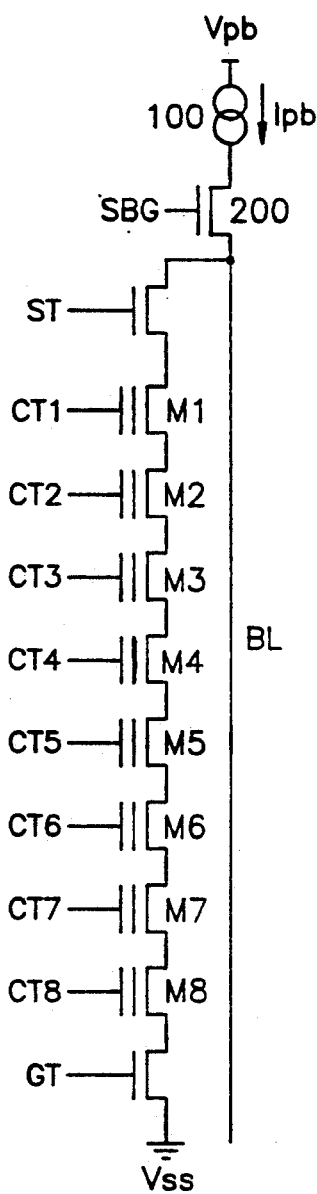
FIG. 2A is an equivalent circuit of a string unit in a NAND type non-volatile memory according to this invention.

Referring to FIG. 2A, there are shown a string selection transistor ST, a ground connection transistor GT and eight cascaded cell transistors CT1-CT8. This structure is the same as FIG. 1. However, the inventive circuit is additionally provided a high voltage supplying means 100 and a bit line selection transistor 200 connected in series between a high voltage Vpb and a bit line BL.

Figures 2B, 2C:
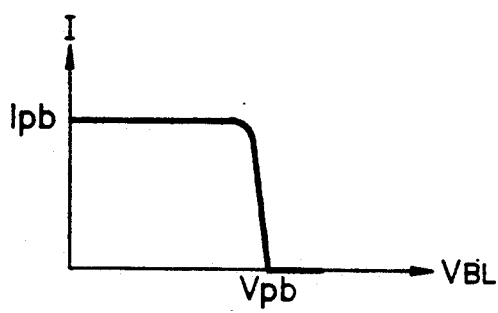
FIG. 2B is a table for showing the method of erasing, writing and reading of the cells according to this invention.
FIG. 2C is a graph for showing the current-voltage characteristics of the current source in FIG. 2A.

FIG. 2B shows the state of erasing voltages used in the inventive circuit. It should be noted that the erasing operation is divided into the primary and secondary erasing steps. The first erasing step is performed in the same way as in FIG. 1A. In the present embodiment, a independent current source is used as the high voltage supplying means 100 However, any voltage source may be used if it has the current-voltage characteristics as shown in FIG. 2C, where Ipb and $V_{BL}$ are the current of the high voltage applying source and the voltage of the bit line respectively.

According to the present invention, the erasing operation is divided into two steps. The primary erasing step is to erase the cells at memory string unit in the conventional way, while the secondary erasing is to adjust the threshold voltage of the over-erased cell transistors to the proper level of 2-3 V.

Figure 4:
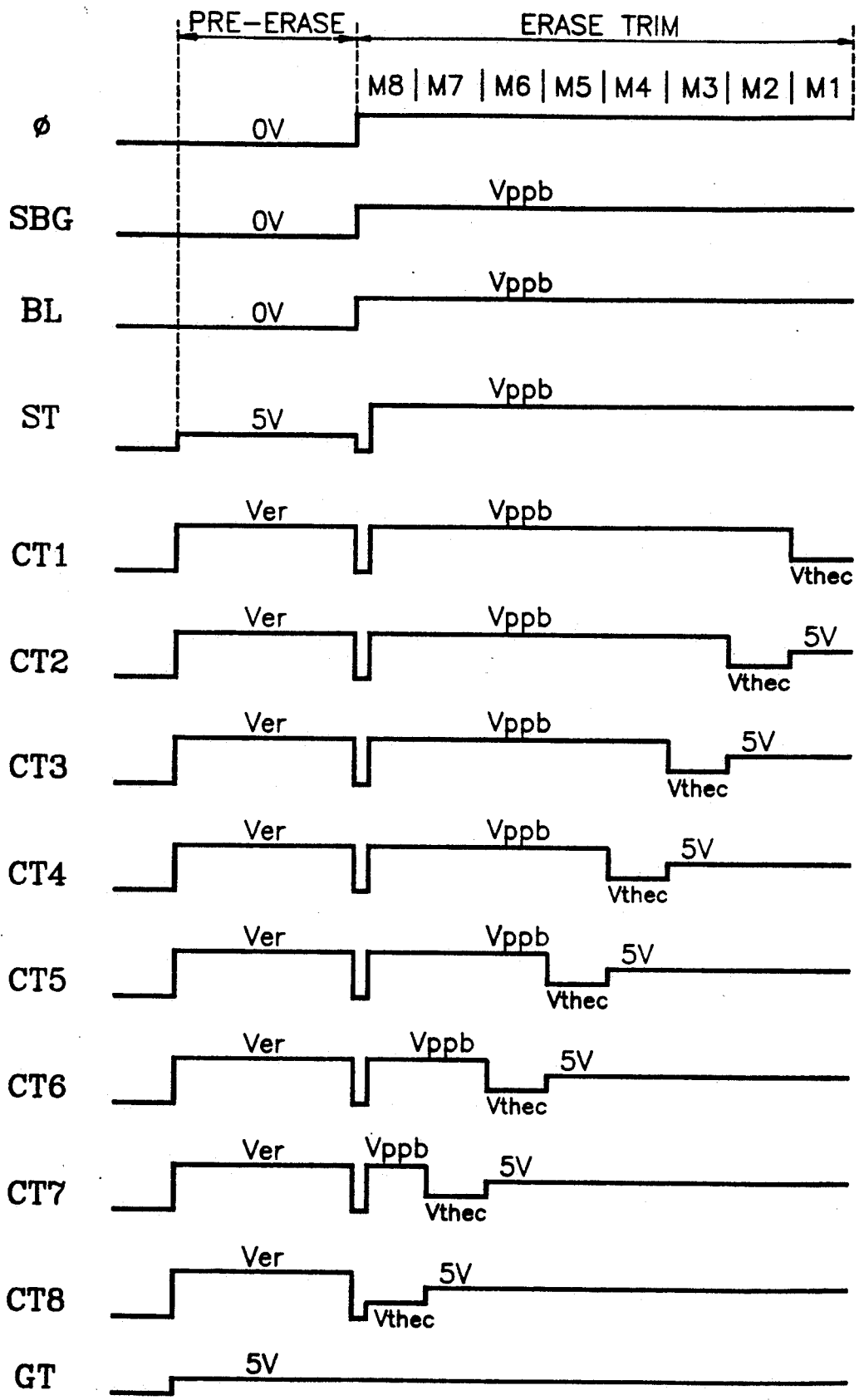
FIG. 4 is a diagram for illustrating the voltage states of the circuit according to this invention.

Referring to FIGS. 2B and 4, the bit line BL and the gate SBG of the bit line selection transistor 200 are applied with 0V in the primary erasing step. The bit line selection transistor 200 is turned off so that the high voltage Vpb of the high voltage supplying means 100 can not affect the bit line. The gates of the string selection transistor ST and the ground selection transistor GT are applied with 5V, while the gates of all the cell transistors CT1-CT8 are applied with an erasing voltage Ver of 13 V.

Figure 2D:
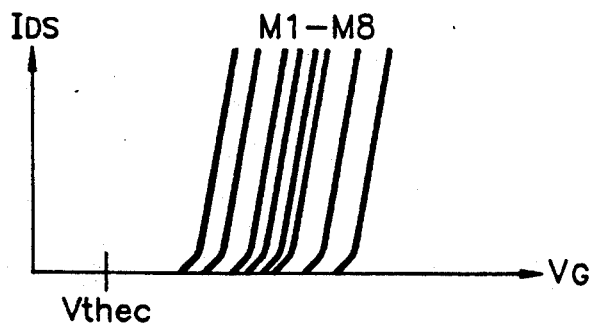
FIG. 2D is a graph for showing the current-voltage characteristics of the primarily erased cells in FIG. 2A.
Figure 2E:
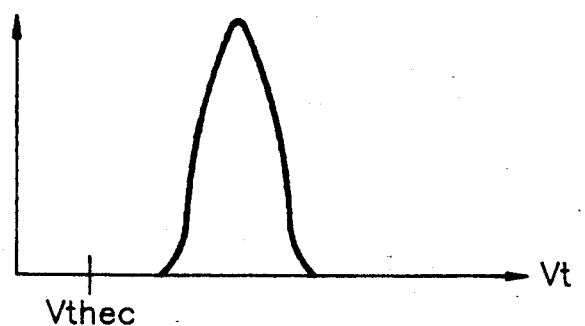
FIG. 2E is a graph for showing the threshold voltage distribution of the primarily erased cells in FIG. 2A.
Figure 2F:
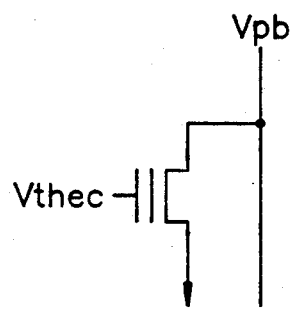
FIG. 2F is an equivalent circuit of a selected cell when performing the secondary erasing step in FIG. 2A.

As shown in FIGS. 2D and 2E, where $I_{DS}$, $V_G$ and Vt are the current between the drain and the source, the gate voltage and the cell threshold voltage respectively, the threshold voltage of the erased cells is higher than the proper threshold voltage Vthec, which indicates the over-erased state. In FIGS. 2D and 2E, all the cells of the string are illustrated over-erased for description purpose, but only a few cells may be over-erased.

The secondary erasing step is to optimize the threshold voltage of the over-erased cells to the proper value Vthec, and it is performed sequentially from the eighth cell CT8 to the first cell CT1.

For adjusting the threshold voltage of the cell transistor CT8 to the optimum value Vthec, gating high voltage Vppb is applied to the gates of the bit line selection transistor 200, the first to seventh cell transistors CT1-CT7 and the string selection transistor ST. Then the high voltage Vpb of the high voltage supplying means 100 is transferred to the drain of the cell transistor CT8. Meanwhile, the gate of CT8 is supplied with the optimum threshold voltage Vthec. In this case, the level of the gating high voltage Vppb should be high enough to transfer the high voltage Vpb to the drain of CT8, and the level of the optimum threshold voltage Vthec is set to have 2-3 V. More specifically describing with reference to FIG. 2G, the electrons remaining in the floating gate that cause the increase of the threshold voltage after the primary erasing step tunnel into the drain because the level of the high voltage Vpb applied to the drain of the cell transistor CT8 is higher than the optimum threshold voltage Vthec applied to the gate. Therefore the program operation is performed until the threshold voltage arrives at the optimum value Vthec.

When the threshold voltage of the cell transistor CT8 arrives at the optimum value Vthec, the cell transistor CT8 is turned on, so that the cell transistor flow the current Ipb of the high voltage supplying means 100. The current Ipb flows through the turned-on transistor CT8 to the ground voltage Vss, so that the level of the high voltage Vpb applied to the drain of the cell transistor CT8 is dropped in accordance with the current-voltage characteristics of the high voltage supplying means as shown in FIG. 2C. Accordingly the automatic program operation is not further performed on the cell transistor CT8.

Figure 2G:
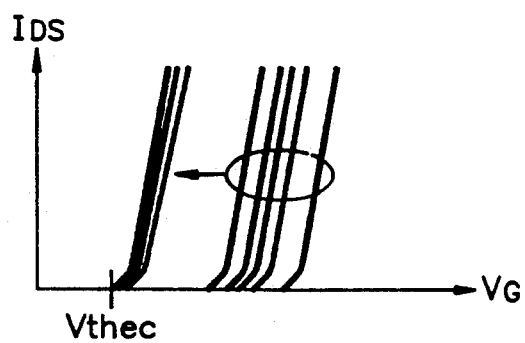
FIG. 2G is a graph for showing the threshold voltage distribution of the secondarily erased cells.

The erasing operation of the cell transistor CT7-CT1 is performed in the like manner. Namely, only the gate of the cell transistor subject to the secondary erasing is applied with the optimum threshold voltage Vthec, while the gates of the cell transistors between the erased cell transistor and the bit line are applied with the gating high voltage Vppb and the gates of the cell transistors between the erased cell transistor and the ground voltage with the turn-on voltage 5V. The cell transistors between the erased cell transistor and the ground voltage already have the optimum threshold voltage through the secondary erasing step. Thus the threshold voltage of the cell transistors can be optimized to the optimum value Vthec as shown in FIG. 2G.

Figure 3:
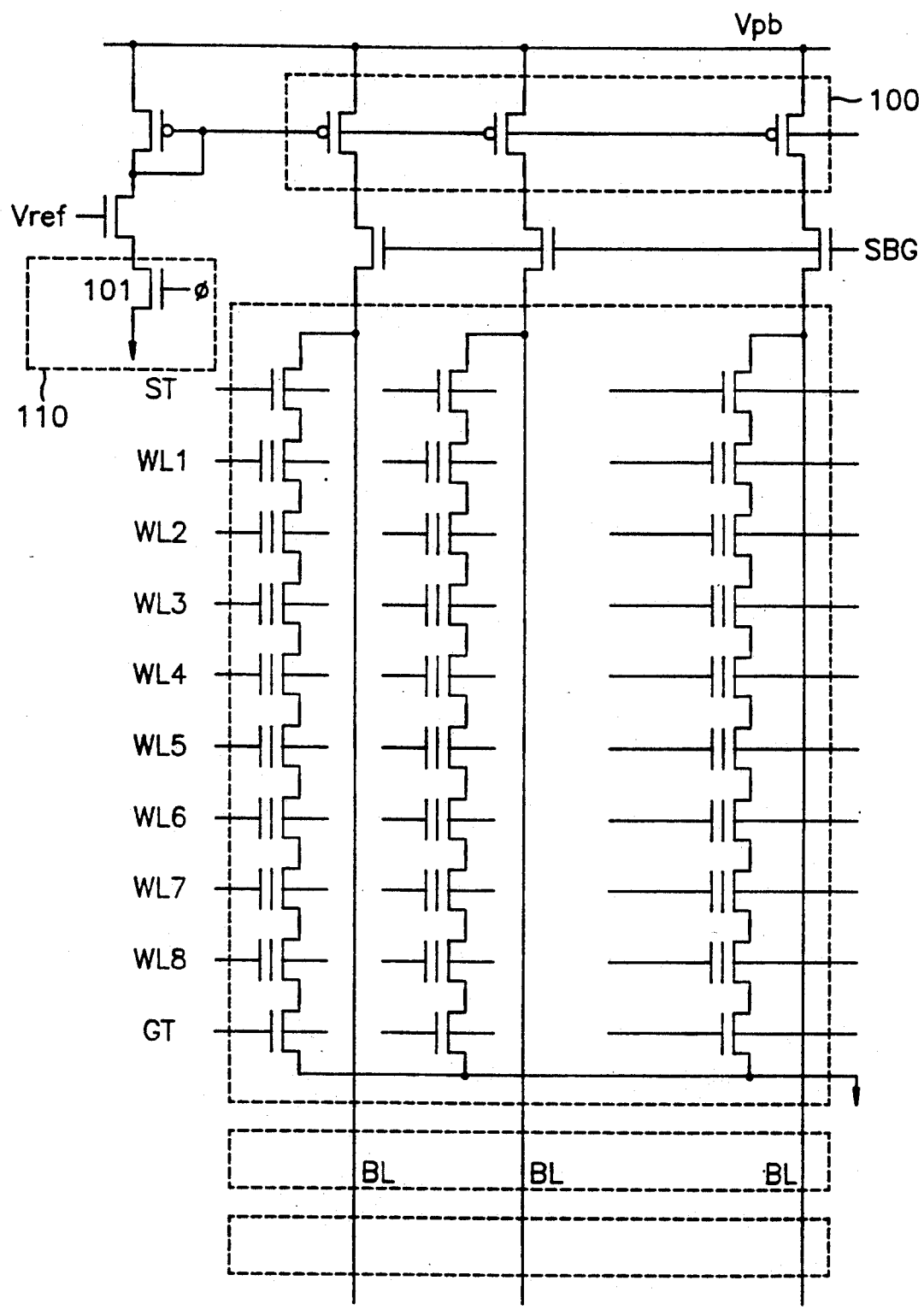
FIG. 3 is a schematic diagram of a circuit according to an embodiment of this invention.

In the embodiment of FIG. 3, where $V_{ref}$ is a predetermined reference voltage, P-type MOS transistors are utilized as the high voltage supplying means 100 The output of the circuit 110 for controlling the gate of the P-type MOS transistor depends on the clock signal φ. The secondary erasing step may be performed only when the clock signal φ has the level of 5V to turn on the NMOS transistor 101. The cell transistors connected with one word line form a page, and the secondary erasing step is sequentially performed from the 8th page to 1st page.

The gating high voltage Vppb may be produced by a high voltage generation circuit conventionally used in the EEPROM, and any means with the output characteristics as shown in FIG. 2C may be utilized as the high voltage supplying means 100 for those as shown in FIGS. 2A and 3A.

As described above, the over-erased cells may be adjusted to have the optimum threshold voltage in the NAND-type EEPROM such that the non-uniformity and over-erasing of the cells are prevented, thus the reliability of the EEPROM is improved.

What is claimed is:

1. A device for achieving optimum erasure of the memory cells of a NAND type flash EEPROM, comprising:
    a bit line;
    word lines;
    a memory string of cell transistors with gates respectively connected to said word lines and channels cascaded between said bit line and a ground terminal;
    high voltage supplying means connectable to said bit line and said memory string, for generating a first high voltage;
    a bit line selection transistor with a channel connected between said high voltage supplying means and said memory string, and a gate connected to a bit line selection signal; and
    erasing voltage applying means coupled to said bit line selection transistor and said memory, string for applying a first operational voltage to the gate of said bit line selection transistor and an erasing voltage to the gates of said cell transistors during a first erasing operation, and for applying a second operational voltage to the gate of a selected cell transistor from said cell transistors, a third operational voltage to the gates of one group of said cell transistors between said selected cell transistor and said ground terminal, a second high voltage to the gates of another group of said cell transistors between said bit line and said selected cell transistor and to the gate of said bit line selection transistor, and said first high voltage to the drain of said selected cell transistor during a second erasing operation.

2. The device for achieving optimum erasure of the memory cells of a NAND type flash EEPROM as claimed in claim 1, wherein said second operational voltage is a voltage used to adjust the threshold voltage of said selected cell transistor within a threshold voltage range.

3. The device for achieving optimum erasure of the memory cells of a NAND type flash EEPROM as claimed in claim 1, wherein said high voltage supplying means produces said first high voltage to said bit line only during said second erasing operation via said bit line selection transistor.

4. The device for achieving optimum erasure of the memory cells of a NAND type flash EEPROM as claimed in claim 1, wherein said second high voltage is equal to or higher than said first high voltage.

5. A device for achieving optimum erasure of the memory cells of an EEPROM with word lines and bit lines, comprising:
    high voltage supplying means electrically connectable to each of said bit lines, for generating a first high voltage;
    a bit line selection transistor with one end of a channel coupled to receive said first high voltage and a gate coupled to receive one of a first operational voltage and a second high voltage;
    one group of non-selected cell transistors with channels cascaded from the other end of the channel of said bit line selection transistor and gates commonly connected to said second high voltage;
    a ground connection transistor with one end of a channel connected to a ground terminal and a gate coupled to receive a third operational voltage;
    another group of non-selected cell transistors with channels cascaded from the other end of the channel of said ground connection transistor and gates commonly connected to receive said third operational voltage; and
    a selected cell transistor with a channel cascaded between said one group of non-selected cell transistors and said another group of non-selected cell transistors and a gate connected to receive a second operational voltage.

6. The device as claimed in claim 5, wherein said first operational voltage and said third operational voltage are respectively a ground voltage and a source voltage.

7. The device as claimed in claim 5, wherein said second operational voltage is a voltage used to adjust the threshold voltage of said selected cell transistor within a threshold voltage range.

8. The device as claimed in claim 5, wherein said second high voltage is equal to or higher than said first high voltage.

9. In a flash EEPROM comprising memory strings each comprising a bit line, word lines and cell transistors with the gates of said cell transistors respectively connected to said word lines and the channels cascaded between said bit line and a ground terminal, string selection transistors connected between said bit lines and said memory strings, ground connection transistors connected between said memory strings and said ground terminal, a high voltage generator connectable to said bit lines for supplying a first high voltage, and bit line selection transistors with the channels connected between said high voltage generator and said memory strings, a method for achieving optimum erasure of said memory cells comprising:
    a first erasing step for commonly applying a first operational voltage to the gates of said bit line selection transistors, an erasing voltage of a given level to the gates of said cell transistors and a third operational voltage to the gates of said ground connection transistors and said string selection transistors;
    a second erasing step for commonly applying a second high voltage to the gates of said bit line selection transistors and said string selection transistors, said second high voltage to the gates of one group of non-selected cell transistors coupled between said string selection transistors and a selected cell transistors, a second operational voltage to the gate of said selected cell transistors, said third operational voltage to the gates of another group of non-selected cell transistors coupled between said selected cell transistor and said ground connection transistors and to the gates of said ground connection transistors.

10. The method for achieving optimum erasure of said memory cells as claimed in claim 9, wherein said second erasing step further comprises:
an initial step for applying said third operational voltage to the gates of said ground connection transistors, said second operational voltage to the gate of the selected cell transistor adjacent to said ground connection transistors, said second high voltage to the gates of said bit line selection transistors and string selection transistors and to the gates of said one group of non-selected cell transistors between said selected cell transistor and string selection transistors;
a final step for applying said third operational voltage to the gates of said ground connection transistors, said second operational voltage to the gate of said selected cell transistor, said third operational voltage to the gates of said another group of non-selected cell transistors between said selected cell transistor and ground connection transistors and said second high voltage to the gates of said bit line selection transistors and said string selection transistors.

11. The method for achieving optimum erasure of said memory cells as claimed in claim 9, wherein said second operational voltage is a voltage used to adjust the threshold voltage of said selected cell transistor within a threshold voltage range.

12. The method for achieving optimum erasure of said memory cells as claimed in claim 9, wherein said second high voltage is at least equal to said first high voltage or higher than said first high voltage.

13. The method for achieving optimum erasure of said memory cells as claimed in claim 10, wherein said second operational voltage is a voltage used to adjust the threshold voltage of said selected cell transistor within a threshold voltage range.

14. The method for achieving optimum erasure of said memory cells as claimed in claim 10, wherein said second high voltage is at least equal to said first high voltage or higher than said first high voltage.

15. A device for achieving optimum erasure of memory cells, comprising:
a bit line;
a memory string having a string selection transistor, a plurality of memory cells and a ground transistor serially connected and interposed between said bit line and ground;
high voltage generating means for generating a high voltage;
a bit line selection transistor having a principal electrically conducting channel interposed between said high voltage generating means and said memory string, for enabling application of said high voltage onto said memory string; and
erasing means coupled to said bit line selection transistor and said memory string, for erasing information of said memory cells and maintain voltages of the erased memory cells within an optimum threshold voltage range, said erasing means comprising the steps of:
enabling application of a first voltage to control electrodes of said string selection transistor and said ground transistor, and an erasing voltage to control electrodes of each of said plurality of memory cells for erasing information of said memory cells while disabling operation of said bit line selection transistor to thereby disable application of said high voltage onto said memory string; and
enabling application of said high voltage onto said bit line and a threshold voltage to a control electrode of a selected erased memory cell from the plurality of erased memory cells while maintaining first unselected erased memory cells between said selected erased memory cell and said ground transistor at said first voltage, and applying an intermediate high voltage to control electrodes of second unselected erased memory cells between said selected erased memory cell and said bit line selection transistor for maintaining said voltages of the erased memory cells within said optimum threshold voltage range.

16. The device for achieving optimum erasure of memory cells as claimed in claim 15, wherein said first voltage is 5 volts, said erasing voltage is 13 volts and said optimum threshold voltage range is about 2-3 volts.

17. The device for achieving optimum erasure of memory cells as claimed in claim 15, wherein said intermediate high voltage is being used to transfer current generated by said high voltage to a drain of said selected erased memory cell for maintaining the voltages of the erased memory cells within said optimum threshold voltage range.

18. A method for achieving optimum erasure of memory cells of a memory device having a memory string comprising a string selection transistor, a plurality of memory cell transistors and a ground transistor serially connected and interposed between a bit line and ground, a high voltage generator for generating a high voltage, and a bit line selection transistor having a channel interposed between the high voltage generator and the memory string for enabling application of said high voltage onto said memory string, said method comprising the steps of:
enabling simultaneous application of a first voltage to control electrodes of said string selection transistor and said ground transistor, and an erasing voltage to control electrodes of each of said plurality of memory cells for erasing information of said memory cells while disabling operation of said bit line selection transistor to thereby disable application of said high voltage onto said memory string during a pre-erase cycle; and
enabling application of said high voltage onto said bit line and a threshold voltage to a control electrode of a selected erased memory cell from the plurality of erased memory cells while maintaining first unselected erased memory cells between said selected erased memory cell and said ground transistor at said first voltage, and applying an intermediate high voltage to control electrodes of second unselected erased memory cells between said selected erased memory cell and said bit line selection transistor for maintaining voltages of the erased memory cells within an optimum threshold voltage range during an erase correction cycle.

19. The method as claimed in claim 18, wherein said first voltage is 5 volts, said erasing voltage is 13 volts and said optimum threshold voltage range is about 2-3 volts.

20. The method as claimed in claim 18, wherein said intermediate high voltage is being used to transfer current generated by said high voltage to a drain of said selected erased memory cell for maintaining the voltages of the erased memory cells within said optimum threshold voltage range.

21. A method for achieving optimum erasure of memory cells of a memory device having a memory string comprising a string selection transistor, a plurality of memory cell transistors and a ground transistor serially connected and interposed between a bit line and a ground terminal, a high voltage generator for generating a first high voltage, and a bit line selection transistor having a channel interposed between the high voltage generator and the memory string for enabling application of said first high voltage onto said memory string, said method comprising the steps of:

applying a first operational voltage to a control electrode of the bit line selection transistor, a second operational voltage to control electrodes of the string selection transistor and the ground transistor, and an erasing voltage to control electrodes of said plurality of memory cell transistors during a first erase operation; and applying a third operational voltage to a control electrode of a selected memory cell transistor from the plurality of memory cell transistors, the second operational voltage to control electrodes of first unselected memory cell transistors from the plurality of memory cell transistors located between the selected memory cell transistor and the ground terminal, and a second high voltage to control electrodes of second unselected memory cell transistors located between the selected memory cell transistor and the bit line to transfer the first high voltage from the high voltage generator via the bit line selection transistor to a principal electrically conducting channel of the selected memory cell transistor, during a second erase operation, to adjust the threshold voltage of the selected memory cell transistor to a threshold voltage range.

22. The method as claimed in claim 21, wherein said first operational voltage, said second operational voltage and said erasing voltage of said first erase operation are respectively about 0 volts, 5 volts, and 13 volts, and said third operational voltage of said second erase operation is a voltage sufficient to adjust the threshold voltage of said selected memory cell transistor to the threshold voltage range of 2-3 volts.

23. The method as claimed in claim 21, wherein said second high voltage is equal to or higher than said first high voltage.

* * * * *